(12) United States Patent
Wu et al.

(10) Patent No.: US 10,297,604 B2
(45) Date of Patent: May 21, 2019

(54) SPLIT GATE MEMORY DEVICES AND METHODS OF MANUFACTURING

(71) Applicant: Taiwan Semiconductor Manufacturing Co., Ltd., Hsin-Chu (TW)

(72) Inventors: Chang-Ming Wu, New Taipei (TW); Shih-Chang Liu, Alian Township (TW); Chia-Shiung Tsai, Hsin-Chu (TW); Ru-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/654,293

(22) Filed: Jul. 19, 2017

(65) Prior Publication Data

US 2017/0317095 A1    Nov. 2, 2017

Related U.S. Application Data

(62) Division of application No. 14/276,340, filed on May 13, 2014, now Pat. No. 9,748,255.

(51) Int. Cl.
*H01L 29/66* (2006.01)
*H01L 27/11521* (2017.01)
(Continued)

(52) U.S. Cl.
CPC .. *H01L 27/11521* (2013.01); *H01L 21/28273* (2013.01); *H01L 29/42324* (2013.01);
(Continued)

(58) Field of Classification Search
CPC ......... H01L 27/11521; H01L 29/66825; H01L 29/7881; H01L 29/42324; H01L 21/28273;
(Continued)

(56) References Cited

U.S. PATENT DOCUMENTS 7,928,499 B2 * 4/2011 Liu .................. H01L 21/28273
257/321
2004/0238881 A1 12/2004 Ozawa
(Continued)

OTHER PUBLICATIONS

Non-Final Office Action dated Nov. 5, 2015 for U.S. Appl. No. 14/276,340.
(Continued)

*Primary Examiner* — Marcos D. Pizarro
*Assistant Examiner* — Nelson Garces
(74) *Attorney, Agent, or Firm* — Eschweiler & Potashnik, LLC

(57) ABSTRACT

Some embodiments of the present disclosure relate to method of forming a memory device. In some embodiments, the method may be performed by forming a floating gate over a first dielectric on a substrate. A control gate is formed over the floating gate and first and second spacers are formed along sidewalls of the control gate. The first and second spacers extend past outer edges of an upper surface of the floating gate. An etching process is performed on the first and second spacers to remove a portion of the first and second spacers that extends past the outer edges of the upper surface of the floating gate along an interface between the first and second spacers and the floating gate.

20 Claims, 15 Drawing Sheets

(51) Int. Cl.
*H01L 29/788* (2006.01)
*H01L 21/28* (2006.01)
*H01L 29/423* (2006.01)

(52) U.S. Cl.
CPC .... *H01L 29/6656* (2013.01); *H01L 29/66825* (2013.01); *H01L 29/788* (2013.01); *H01L 29/7881* (2013.01)

(58) Field of Classification Search
CPC .......... H01L 29/6656; H01L 29/788–29/7889; G11C 14/0018; G11C 14/0063; G11C 16/0408; G11C 16/0483; G11C 16/0491; G11C 16/0416; G11C 16/0425; G11C 16/0433; G11C 16/0441; G11C 16/045; G11C 16/0458; G11C 1/5621; G11C 27/005; G11C 2211/5612; G11C 2211/5613; G11C 2216/06; G11C 2216/10; G11C 2216/26; G11C 2216/28; G11C 2229/763
See application file for complete search history.

(56) References Cited

U.S. PATENT DOCUMENTS

2011/0006355 A1\* 1/2011 Shen ................ H01L 21/28273
257/316
2011/0248328 A1\* 10/2011 Shen ................ H01L 21/28273
257/316

OTHER PUBLICATIONS

Final Office Action dated Apr. 28, 2016 for U.S. Appl. No. 14/276,340.
Non-Final Office Action dated Dec. 29, 2016 for U.S. Appl. No. 14/276,340.

Notice of Allowance dated Apr. 24, 2017 for U.S. Appl. No. 14/276,340.

\* cited by examiner

SPLIT GATE MEMORY DEVICES AND METHODS OF MANUFACTURING

REFERENCE TO RELATED APPLICATION

This application is a Divisional of U.S. application Ser. No. 14/276,340 filed on May 13, 2014, the contents of which are hereby incorporated by reference in their entirety.

BACKGROUND

The present disclosure relates to FLASH memory.

FLASH memory is used in a wide variety of electronic applications. Some FLASH memory cells utilize a floating gate field-effect transistor (FET), which stores one or more bits of data in the form of an electric charge within the floating gate. The floating gate resides above a channel region of, and below a control gate of, the FET, but is electrically-isolated from both by a dielectric. In a program mode of operation, the memory cell stores charge when the FET is in an "on" state (i.e., when current flows between the source and drain) by applying a voltage to the control gate, which causes electrons to tunnel from the channel into the floating gate. Because the floating gate is electrically-isolated from the channel region and the control gate, electrons that tunnel into it will remain there indefinitely.

Electric charge trapped within the floating gate screens the electric field from the control gate within the channel, which selectively changes the threshold voltage ($V_t$) of the FET. For FLASH memory devices that use an array of memory cells, the stored data can be read out of the array by measuring which cells have a higher $V_t$ (e.g., store a "1") and which cells have a lower Vt (e.g., store a "0"). Multi-bit cells are also possible, where a single memory cell has more than two discrete $V_t$ states corresponding to more than two data states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
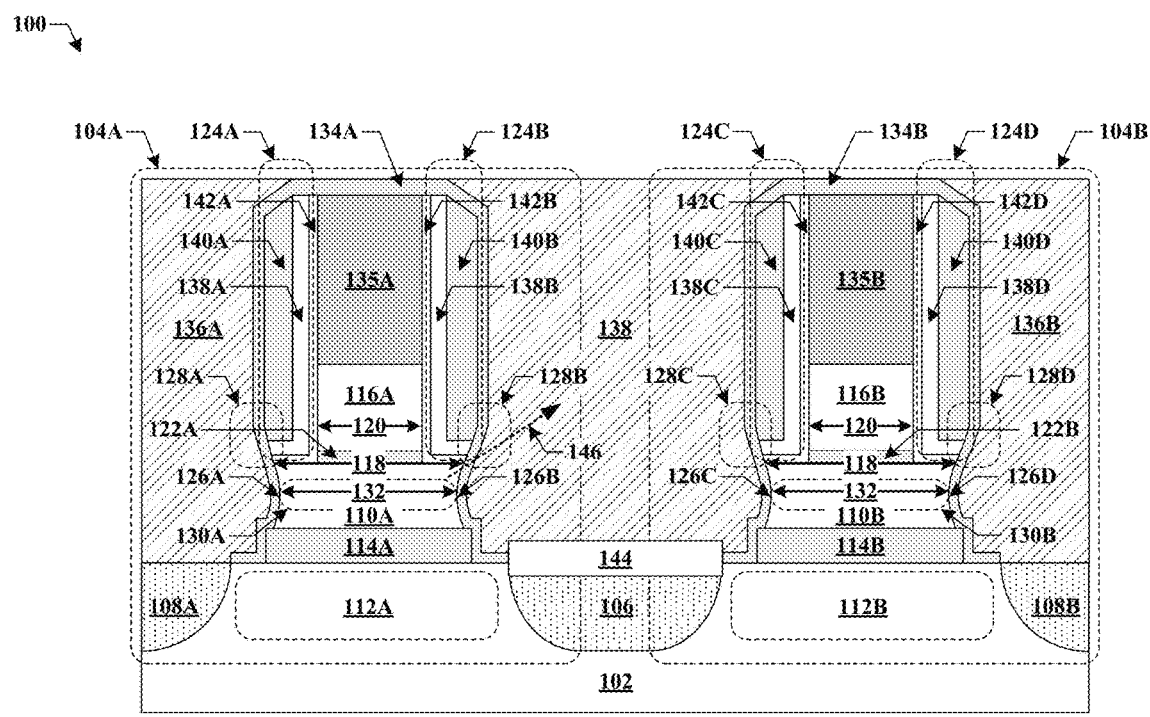
FIG. 1 illustrates some embodiments of a split gate memory device.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some FLASH memory cells utilize a floating gate field-effect transistor (FET) to store data in the form of electric charge. The floating gate FET is arranged on a semiconductor substrate, comprising source/drain regions, which are separated from one another by a channel region. In order to form the floating gate FET, a floating gate is formed over the channel region, and is separated from the channel region by a first dielectric. A control gate formed over the floating gate, and is separated from the floating gate by a second dielectric. First and second spacers are formed along sidewalls of the control gate, and extend over outer edges of the floating gate to form "overhangs" past an upper surface of the floating gate. A tunneling dielectric layer is formed that extends over sidewalls of the floating gate and spacers. An erase gate is then formed adjacent the floating gate, and is separated from the floating gate by the tunneling dielectric layer.

In a program mode of operation of the memory cell (e.g., which writes a logical "0" to the memory cell), a bias is applied to the control gate, which causes electrons to tunnel from the channel region, through the first dielectric, and into the floating gate. In an erase mode of operation (e.g., which writes a logical "1" to the memory cell), a bias is applied to the erase gate, which causes the electrons stored in the floating gate to tunnel through the tunneling dielectric layer and into the erase gate, thus removing the stored charge. Thus, by changing between program and erase operations for flash cells of a memory array, control circuitry can selectively write digitally encoded data consisting of "1"s and "0"s to the flash cells of the array. Unfortunately, however, the overhang of the first or second spacer can impede tunneling of the electrons, because it resides in the path between the floating gate and erase gate. This can increase the erase time of the memory device. Further, the overhang of the spacer can be in the form of a corner that "juts" out into the tunneling dielectric layer. This can cause inconsistencies in the thickness of the tunneling dielectric layer overlying the corner of the spacer and can corresponding variations in the amount of charge place on or removed from the floating gate, which can ultimately cause undesired variations in $V_{ts}$ (write states) written to the cell.

FIG. 1 illustrates a cross-sectional view of some embodiments of a memory device 100 formed on a semiconductor substrate 102, comprising a pair of the memory cells 104A, 104B, having a shared common source region 106 and individual drain regions 108. The shared common source region 106 and an overlying antireflective layer 144 are arranged between the first memory cell 104A and the second memory cell 104B. Each memory cell 104A, 104B includes a floating gate 110A, 110B arranged over a channel region 112A, 112B. First dielectrics 114A, 114B separate the floating gates 110A, 110B from the channel regions 112A, 112B. Control gates 116A, 116B are arranged over the floating gates 110A, 110B. The floating gates 110A, 110B have an upper surface with a first width 118, and the control gates 116A, 116B have a lower surface with a second width 120 that is less than the first width 118. Second dielectrics 122A, 122B separate the control gates 116A, 116B from the floating gates 110A, 110B. Spacers 124A-124D are formed along sidewalls of the control gates 116A, 116B, and are arranged over outer edges 126A-126D of the floating gates 110A, 110B. Tunnel oxide layers 134A, 134B isolate the floating gates 110A, 110B from their respective select gates 136A, 136B, and an erase gate 138 that is shared between the pair of the memory cells 104A, 104B.

FIG. 1 illustrates a cross-sectional view of some embodiments of a memory device 100 formed on a semiconductor substrate 102, comprising a pair of the memory cells 104A, 104B, having a shared common source region 106 and individual drain regions 108. Each memory cell 104A, 104B includes a floating gate 110A, 110B arranged over a channel region 112A, 112B. First dielectrics 114A, 114B separate the floating gates 110A, 110B from the channel regions 112A, 112B. Control gates 116A, 116B are arranged over the floating gates 110A, 110B. The floating gates 110A, 110B have an upper surface with a first width 118, and the control gates 116A, 116B have a lower surface with a second width 120 that is less than the first width 118. Second dielectrics 122A, 122B separate the control gates 116A, 116B from the floating gates 110A, 110B. Spacers 124A-124D are formed along sidewalls of the control gates 116A, 116B, and are arranged over outer edges 126A-126D of the floating gates 110A, 110B. Tunnel oxide layers 134A, 134B isolate the floating gates 110A, 110B from their respective select gates 136A, 136B, and an erase gate 138 that is shared between the pair of the memory cells 104A, 104B.

Lower sidewall regions 128A-128D of the spacers 124A-124D "taper down" towards neck regions 130A, 130B within the floating gates 110A, 110B. The neck regions 130A, 130B comprise a third width 132 that is less than the second width 120 of the upper surface. As will be appreciated in greater detail with manufacturing flows that follow, the lower sidewall regions 128A-128D, previously had overhangs that extended past the outer edges outer edges 126A-126D of the floating gates 110A, 110B. However, an etching process is utilized to remove the overhangs prior to formation of the tunnel oxide layers 134A, 134B, to form a planar interface between the lower sidewall regions 128A-128D and a top region of the floating gates 110, 110B, which improves erase speed of the memory device 100.

The floating gates 110A, 110B are configured to store different amounts of charge (e.g., electrons) in response to independent biasing of select gates 136A, 136B and a shared erase gate 138. Independent biasing of the select gates 136A, 136B and the erase gate 138 allows for writing, reading, and erasing data from the memory device 100. In a write mode of operation of the memory device 100, a voltage applied to one or both of the select gates 136A or 136B, which would write to memory cell 104A or 104B, respectively. For example, in a write mode of operation of the memory cell 104A a voltage applied to select gate 136A, which allows electrons to move between the common source region 106 and drain region 108A and through the channel region 112A. An independent voltage is then applied to the control gate 116A, which promotes tunneling of some the electrons from the channel region 112A, through the first dielectric 114A, and into the floating gate 110A. The electrons are consequently stored within the floating gate 110A indefinitely.

The charge resulting from the stored electrons screens an electric field formed between the control gate 116A and the channel region 112A when the control gate 116A is biased (i.e., with a voltage (V) that is less than the voltage required to promote the tunneling of electrons from the channel region 112A in write mode). This has an effect of increasing the threshold voltage ($V_t$) of memory cell 104A by an amount $\Delta V_t$ that is proportional to the thickness of the first dielectric 114A. In a read mode of operation of the memory cell 104A, the threshold voltage increase $\Delta V_t$ can be used to sense stored charge within each memory cell 104A. By applying a voltage ($V_{CG}$) to the control gate 116A that is greater than $V_t$, but less than $V_t+\Delta V_t$, the stored state within each memory cell 104A, can be sensed. If the memory cell 104A turns on, then it stores a first data state (e.g., a logical "0"). If the memory cell 104A does not turn on, then it stores a second data state (e.g., a logical "1").

In an erase mode of operation of the memory cell 104A, a voltage is applied to the erase gate 138, which allows the electrons to tunnel from the floating gate 110A, through the tunnel oxide layer 134A, and into the erase gate 138, along path 146. As a result, the charge is removed from the floating gate 110A and the memory cell 104A is erased. As will be demonstrated in the embodiments of FIGS. 3A-3I, an overhang comprising material of the second spacer 124B, an which is a product of the fabrication process used to manufacture the memory cell 104A, is formed along path 146. Because the overhang resides along path 146, electrons must tunnel through it, in addition to the tunnel oxide layer 134A, which increases the ease time of the memory cell 104A. However, the etching process utilized to remove the overhang and form the planar interface between the lower sidewall regions 128A top region of the floating gates 110A improves erase speed of the memory cell 104A.

Figure 2:
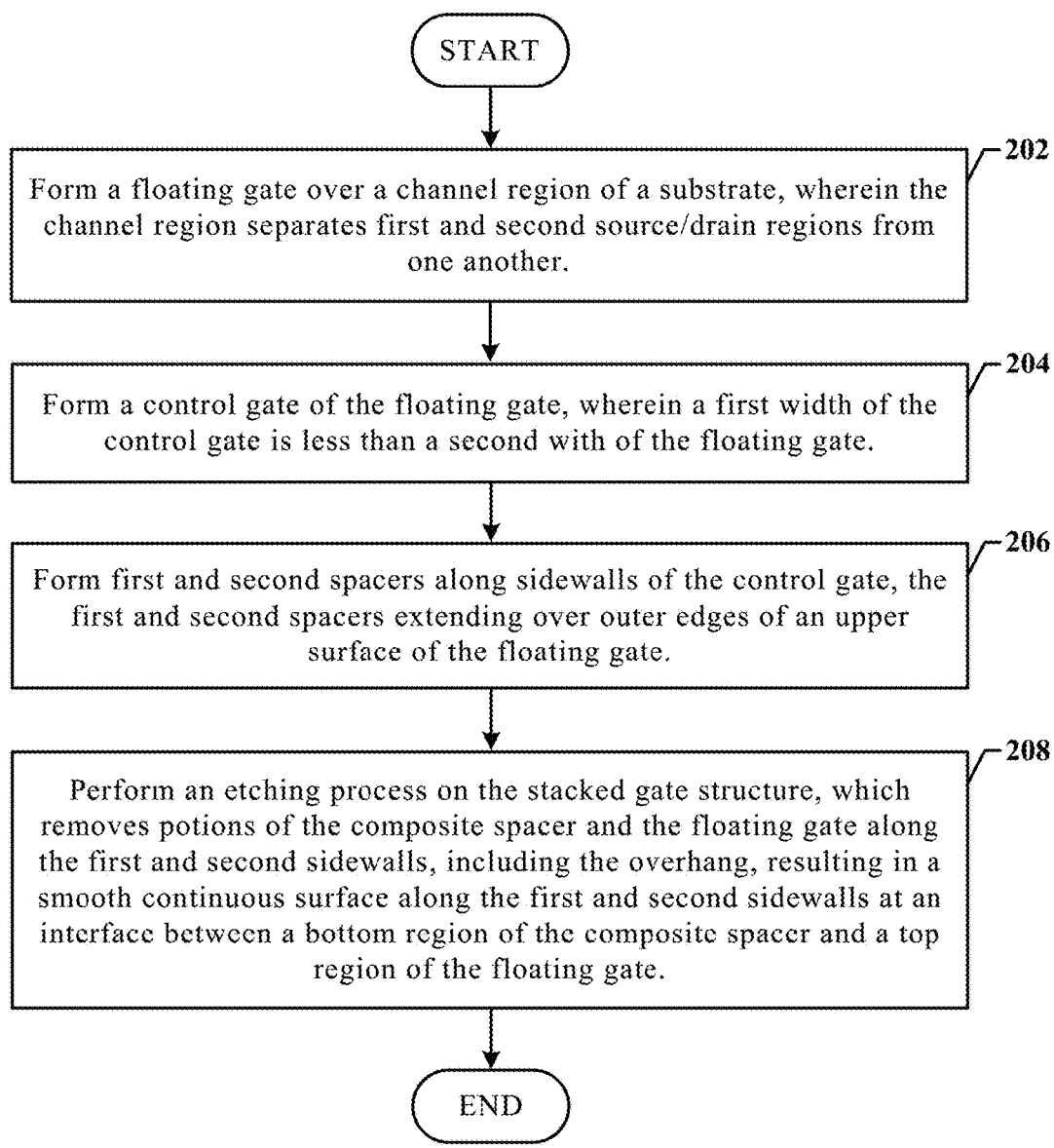
FIG. 2 illustrates some embodiments of a method to form a memory device.

FIG. 2 illustrates some embodiments of a method 200 to form a memory device.

At 202, a floating gate is formed over a channel region of a substrate, and is separated from the channel region by a first dielectric, wherein the channel region separates first and second source/drain regions from one another. In some embodiments, the floating gate and first dielectric are formed by forming a first dielectric layer over the channel, then forming a first polysilicon layer over the first dielectric layer. The first polysilicon layer and first dielectric layer are then patterned, and etched away from areas of the substrate surface, other than the channel region, to form the first dielectric and the floating gate. In other embodiments, the floating gate can be a metal layer, such as a copper, aluminum, nickel, or tungsten layer, or alloys thereof, for example.

At 204, a control gate is formed over the floating gate, and is separated from the floating gate by a second dielectric. A first width of the control gate is less than a second width of the floating gate. In some embodiments, the control gate and second dielectric are formed by forming a second dielectric layer over the first polysilicon layer, then forming a second polysilicon layer over the second dielectric layer. The second polysilicon layer and second dielectric layer are then patterned and etched, along with the first polysilicon and dielectric layers, to form the second dielectric and the control gate. In other embodiments, the control gate can be a metal layer, such as a copper, aluminum, nickel, or tungsten layer, or alloys thereof, for example.

At 206 first and second spacers are formed along sidewalls of the control gate. The first and second spacers extend over outer edges of an upper surface of the floating gate to form overhangs past the outer edges. The overhangs obstruct the path by which electron tunnel out of the floating gate in an erase mode of operation of the memory device, and consequently increase an erase time of the memory device. Formation of the first and second spacers will be demonstrated in detail in the embodiments of FIGS. 3A-3I.

At 208, an etching process is performed on the first and second spacers, which removes the overhangs of the first and second spacers that extend over the outer edges of the floating gate. The etching process removes lower sidewall regions of the first and second spacers, such that the first and second spacers taper down towards a neck region within the floating gate. After the etching process is performed, an interface between a bottom region of the first and second spacers and a top region of the floating gate forms a planar surface.

FIGS. 3A-3I illustrate a series of cross-sectional views that collectively depict formation of a memory device 300. It is appreciated that the embodiments of FIGS. 3A-3I illustrate one possible sequence of manufacturing steps that could result in an overhang of a spacer past outer edges of a top surface of a floating gate. Other manufacturing methods that result in a spacer overhang are also contemplated. Further, although these illustrated cross-sectional views show only a single flash memory cell, it will be appreciated that these manufacturing steps can also be used to form a flash memory array that includes split gate flash memory cells, such as previously illustrated and described in FIG. 1.

Figure 3A:
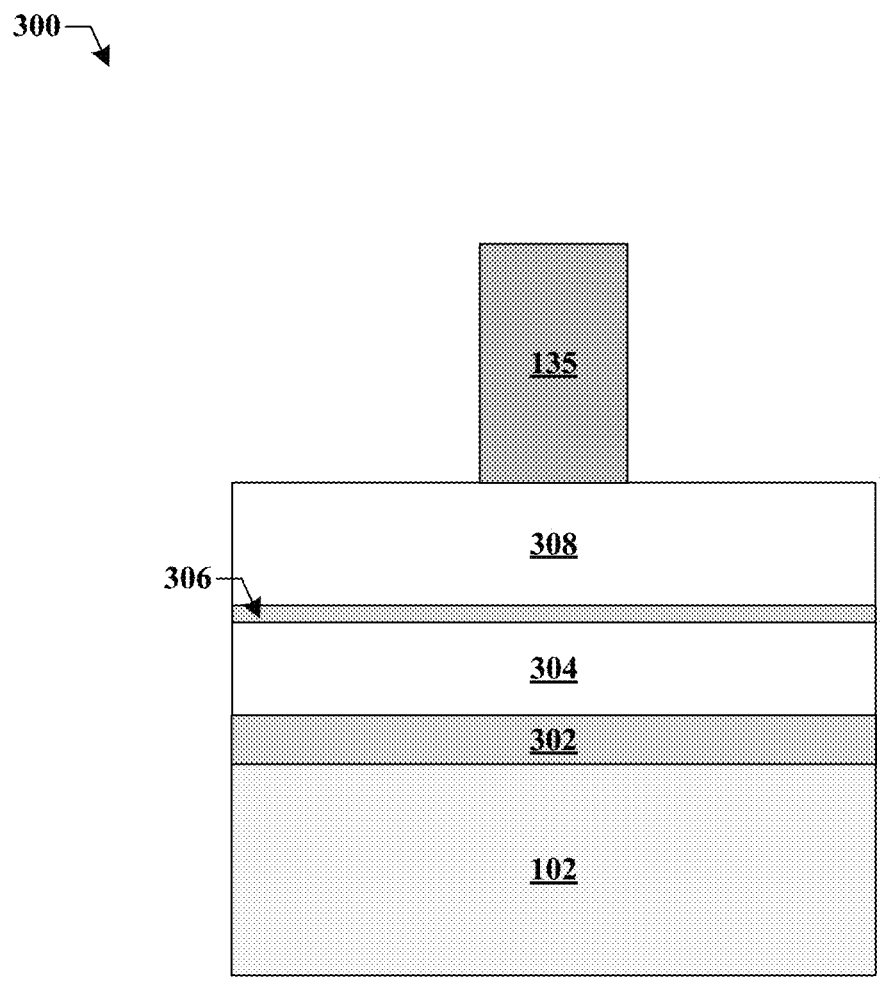
FIGS. 3A-3I illustrate a series of cross-sectional views that collectively depict formation of a memory device.

In FIG. 3A, a series of layers are sequentially-deposited on a surface of a substrate 102 (e.g., Si). The layers include a first dielectric layer 302 (e.g., $SiO_2$), a first gate electrode layer 304 (e.g., polysilicon), a second dielectric layer 306, and a gate electrode layer 308. In some embodiments, the first and second gate electrode layers 304, 308 are formed by a chemical vapor deposition (CVD) process such as low-pressure CVD (LPCVD), plasma-enhanced CVD (PECVD), or other suitable layer deposition process. In some embodiments, the first and second dielectric layers 302, 306 are oxide and are formed by a suitable oxidation technique. A hardmask 135 (e.g., silicon nitride (SiN)) is formed over the second gate electrode layer 308. In some embodiments, the hardmask 135 is formed by forming a hardmask layer (not shown), forming a mask pattern in photoresist over the hardmask layer, and etching the mask pattern into the hardmask layer to form the hardmask.

Figure 3B:
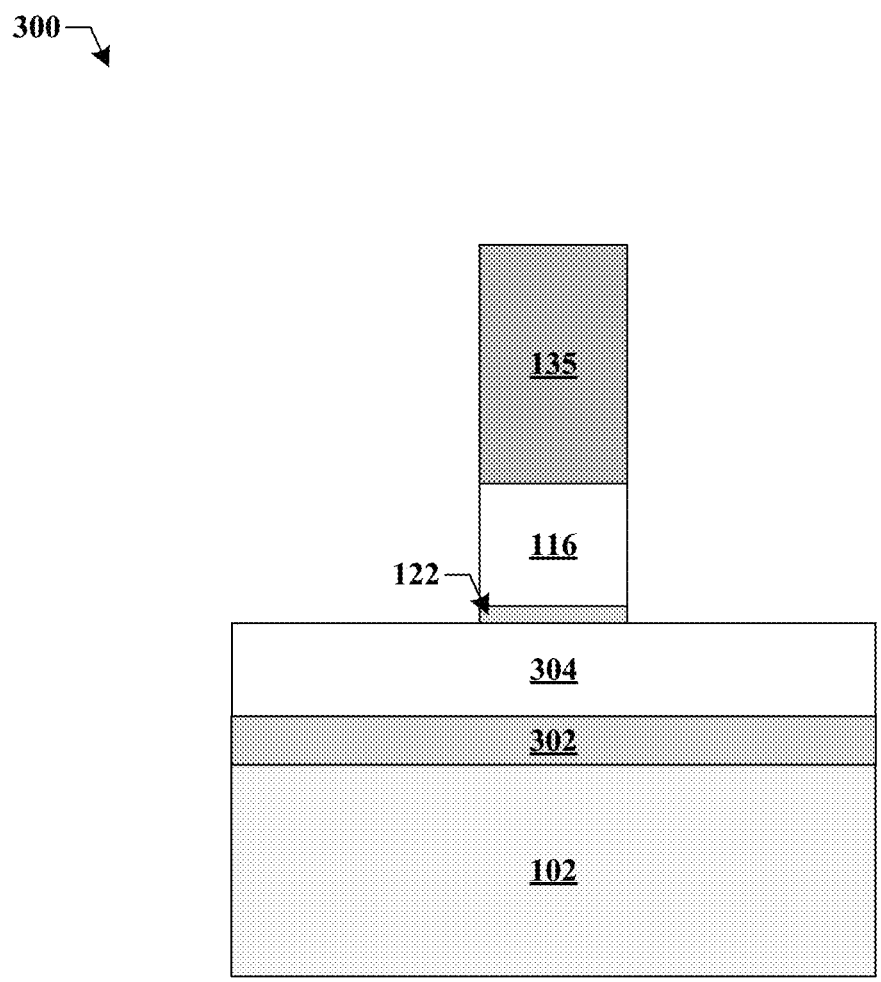
Figure 3C:
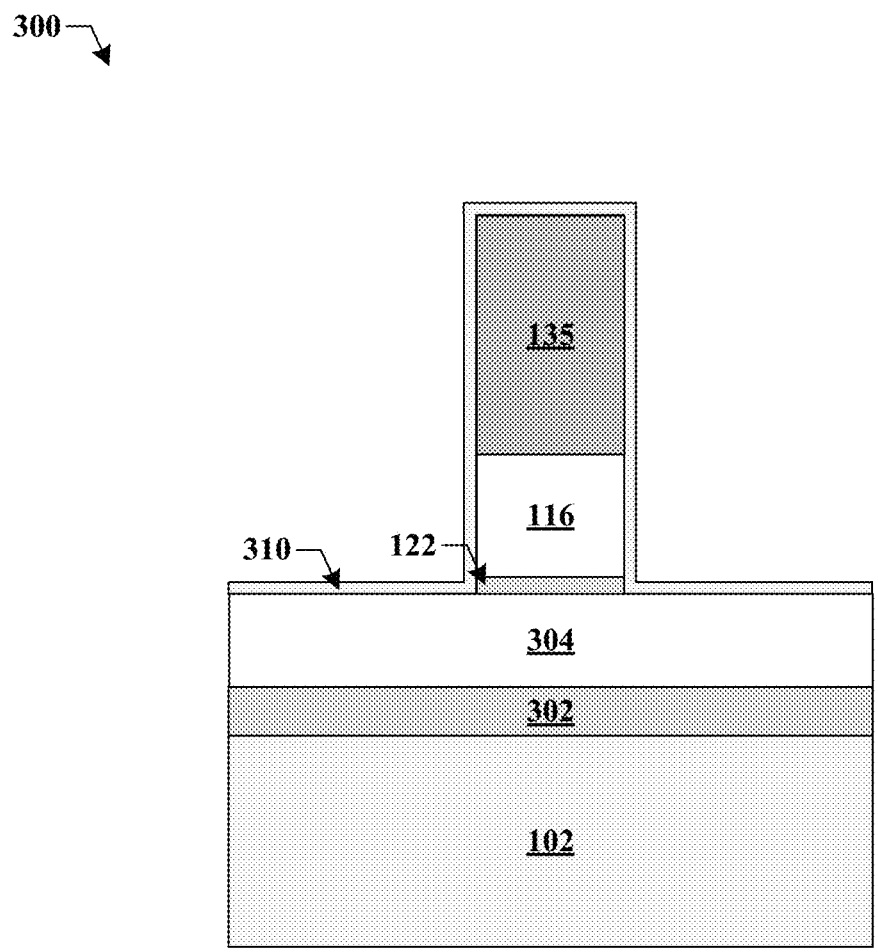

In FIG. 3B, a first etch is performed through the second gate electrode layer 308 and the second dielectric layer 306 to form a control gate 116 and a second dielectric 122. In FIG. 3C, a high temperature oxide (HTO) layer 310 is formed over a top surface and sidewalls of the hardmask 135, along sidewalls of the control gate 116, and over along a top surface of the first gate electrode layer 304.

Figure 3D:
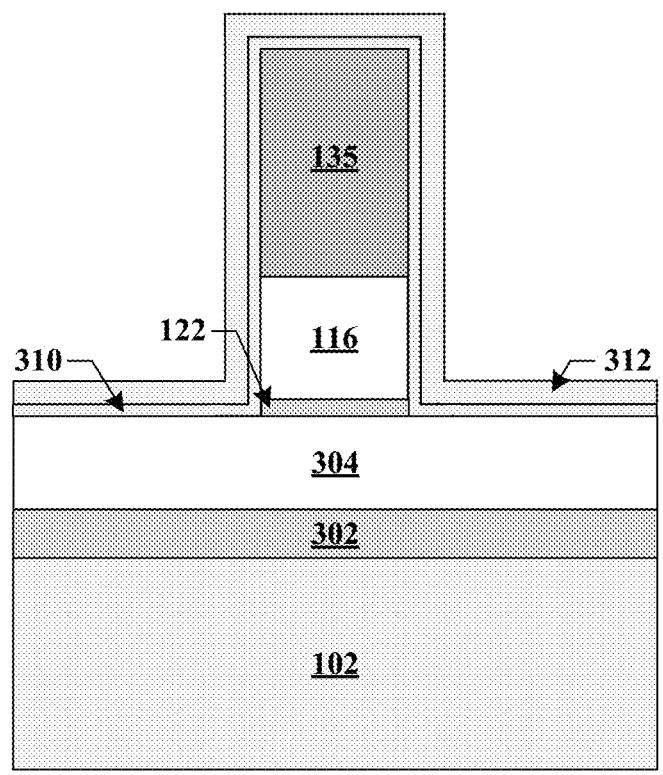

In FIG. 3D, an oxide layer 312 is formed on the HTO layer 310.

Figure 3E:
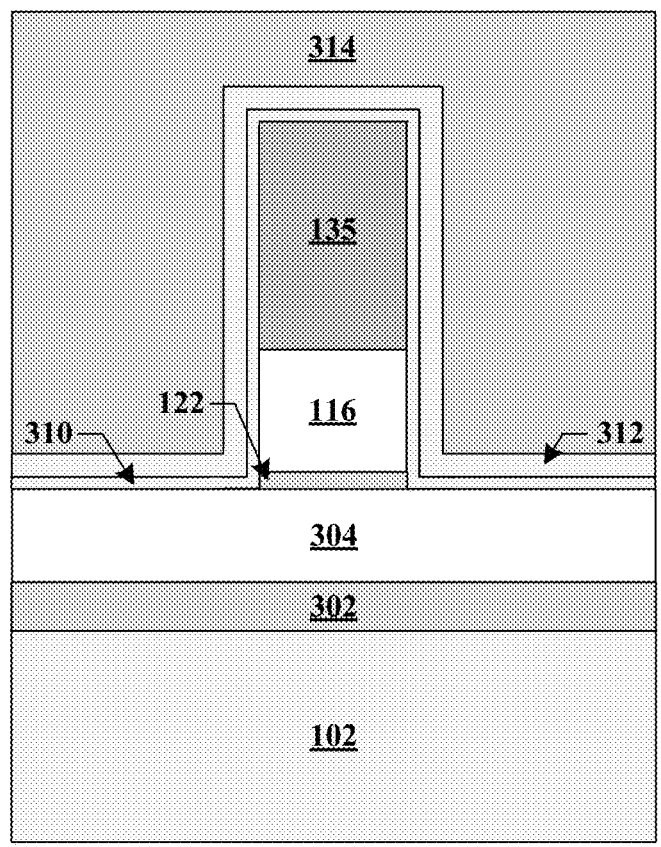

In FIG. 3E, a encapsulating layer 314 (e.g. SiN) is formed over the oxide layer 312. In some embodiments, the encapsulating layer 314 is formed by atomic layer deposition (ALD), CVD, or physical vapor deposition (PVD).

Figure 3F:
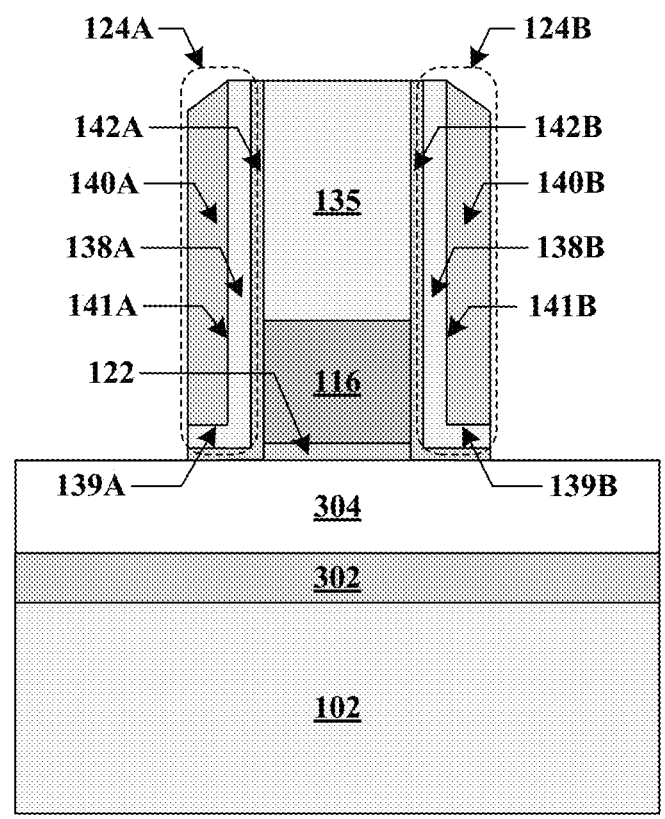

In FIG. 3F, portions of the encapsulating layer 314, oxide layer 312, and HTO layer 310 are removed by a suitable etch process to form first and second spacers 124A, 124B. The first and second spacers 124A, 124B each comprise a spacer dielectric layer 138A, 138B, which is formed from the oxide layer 312. The spacer dielectric layer 138A, 138B comprises a horizontal portion that extends over the first gate electrode layer 304 upper surface, and a vertical portion that extends along sidewalls of the control gate 116 and hardmask 135. The first and second spacers 124A, 124B each further comprise a spacer encapsulating layer 140A, 140B (e.g., SiN), which is formed from the encapsulating layer 314, and which extends over the lower horizontal portions 139A, 139B of the spacer dielectric layer 138A, 138B, and extends vertically adjacent the vertical sidewall portions 141A, 141B of the spacer dielectric layer 138A, 138B.

For the embodiments of FIGS. 3A-3I, the first and second spacers 124A, 124B are formed as described by FIGS. 3A-3F. However, for other embodiments, the first and second spacers 124A, 124B may be formed by various other means, and may comprise materials and geometries other than those shown in the embodiments of FIGS. 3A-3F. For example, rather than being made up of the three illustrated layers, the spacers may be made of a single continuous body, or can include one or more conductive layers that act as a control gate of sorts.

Figure 3G:
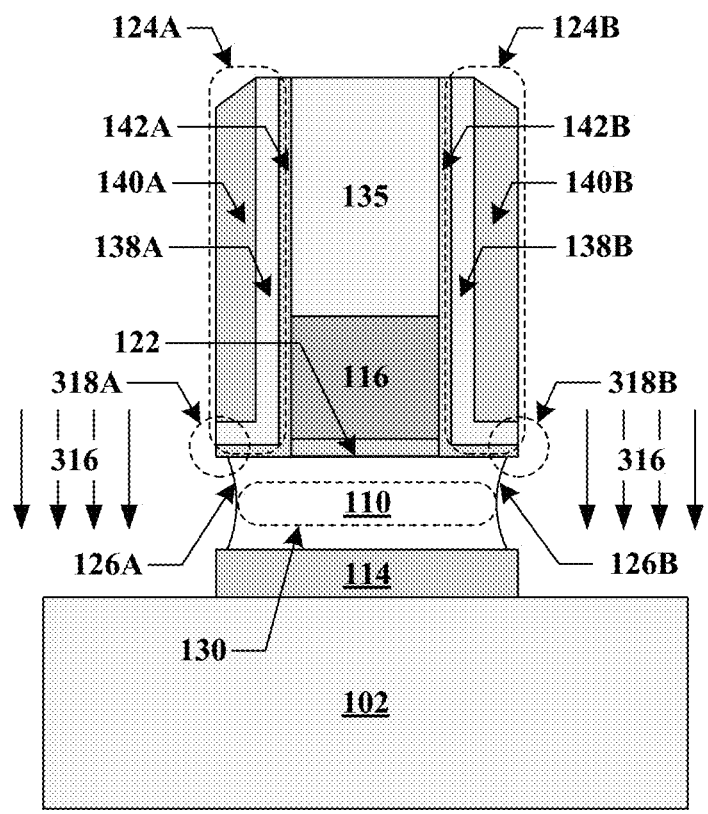

In FIG. 3G, portions of the first dielectric layer 302 and the first gate electrode layer 304 are removed by a suitable etch process 316 to form a first dielectric 114 and floating gate 110. In some embodiments, the etch process 316 comprises a wet etch or a reactive ion etch (RIE). The etch process 316 removes portions of the first dielectric layer 302 and the first gate electrode layer 304 not covered by the hardmask 135 and the first and second spacers 124A, 124B. The etch process 316 also etches first and second sidewalls 126A, 126B of the floating gate 110 to produce "undercuts," wherein the first and second sidewalls 126A, 126B bow inwards to produce a neck region 130 within the floating gate 110. Conversely, sidewalls of the first and second spacers 124A, 124B are not etched, and form first and second "overhangs" 318A, 318B, which extend over the outer edges of an upper surface of the floating gate (i.e., extend past the first and second sidewalls 126A, 126B) at an interface between a bottom region of the first and second spacers 124A, 124B and a top region of the floating gate 110. The overhangs 318A, 318B reside in the potential tunneling path, along which electrons tunnel out of the floating gate in an erase mode of the memory, which increases the erase time of the memory device.

Figure 3H:
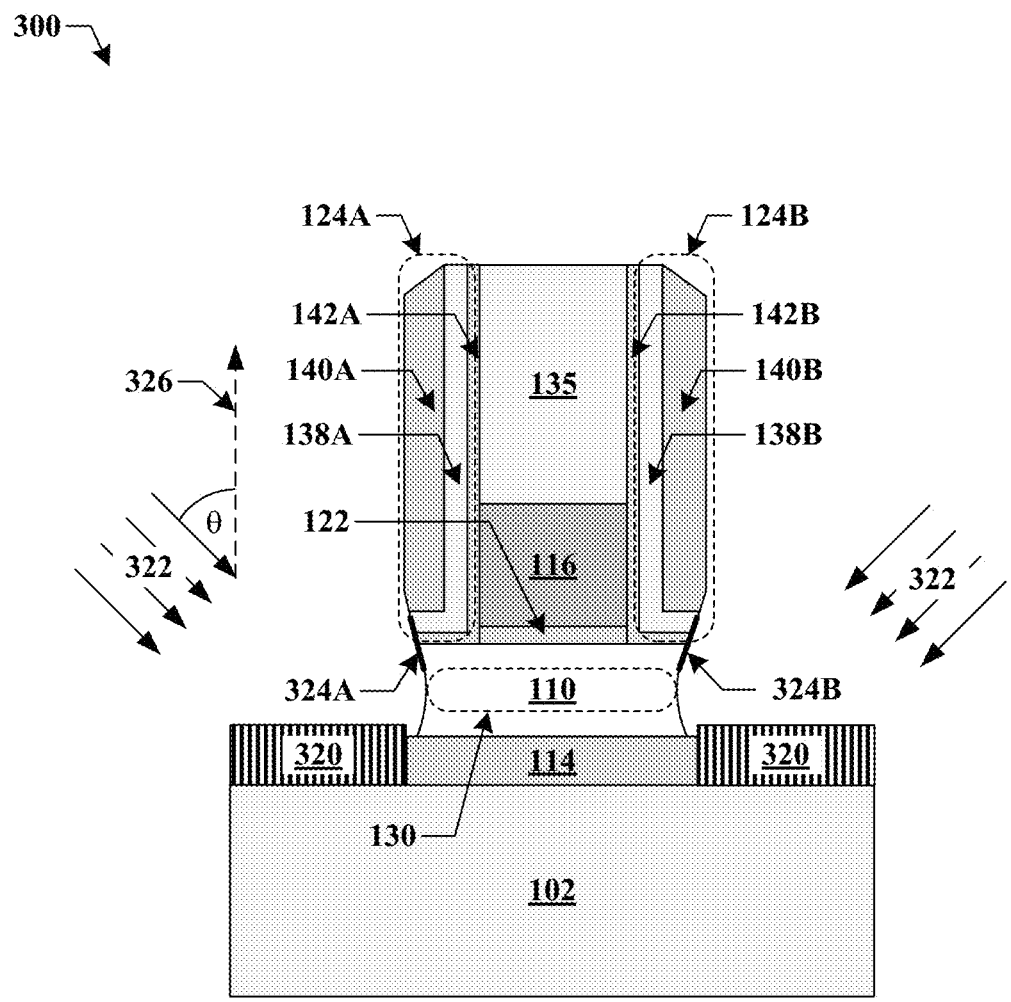

In FIG. 3H, a bottom antireflective coating (BARC) layer 320 is formed over the surface of the substrate 102. An appropriate etching process 322 is then performed on the first and second spacers 124A, 124B and floating gate 110. The etching process 322 removes the overhangs 318A, 318B, which had extended over the outer edges (i.e., first and second sidewalls 126A, 126B), such that the first and second spacers 124A, 124B taper down towards the neck region 130 within the floating gate 110. The etching process 322 results in smooth planar surfaces 324A, 324B at an interface between a bottom region of the first and second spacers 124A, 124B and a top region of the floating gate 110. In some embodiments, the etching process 322 is performed at an angle ($\theta$) between about 30° and 50° with a normal vector 326 to the surface of the substrate 102. In some embodiments, the etching process 322 comprises an argon sputter or ion beam etch, whereby a beam of ions or molecular species bombard the overhang regions to erode away the overhand regions to provide a tapered and/or planar surface 324B without corners.

Figure 3I:
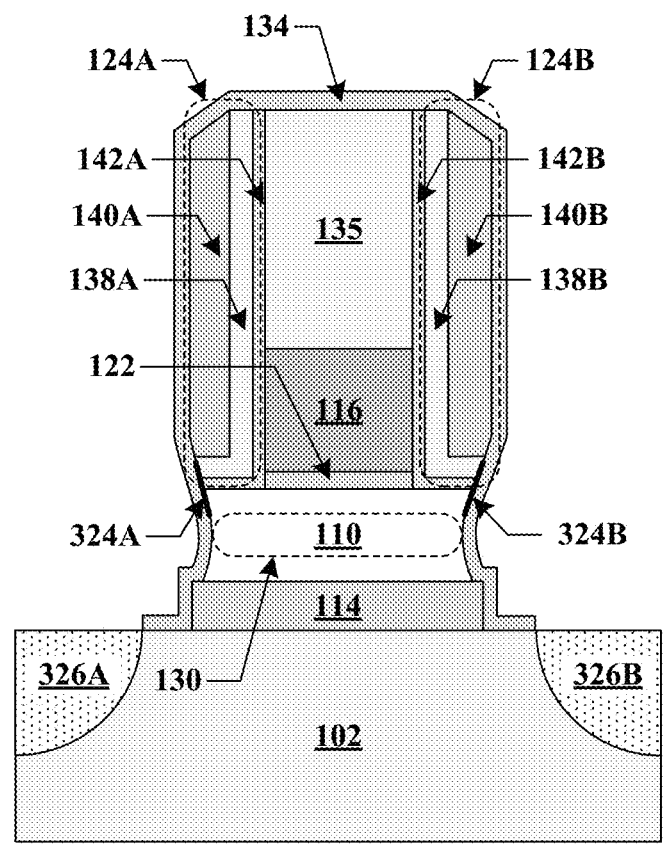

In FIG. 3I, a tunnel dielectric layer 134 is formed over the memory device 300 by an appropriate layer deposition technique. In some embodiments, the tunnel dielectric layer 134 comprises an oxide with a uniform thickness. First and second source/drain regions 326A, 326B are then formed within the substrate 102. In some embodiments, a pair of memory devices 300 are formed on the substrate 102 by the method of FIGS. 3A-3I, or other appropriate method, and share a common source 106 as illustrated in FIG. 1.

For the embodiments of FIGS. 1, 2 and 3A-3I, the control gate is narrower than the floating gate, such that floating gate upper surface regions extend outwardly past edges of the control gate, and the first and second spacers are formed over the floating gate upper surface, which form the overhangs. In some embodiments of memory device formation, the control gate is wider than the floating gate. In such embodiments, the control gate itself forms the overhang. However, the aforementioned etching process can be used to remove the overhangs.

Figure 4:
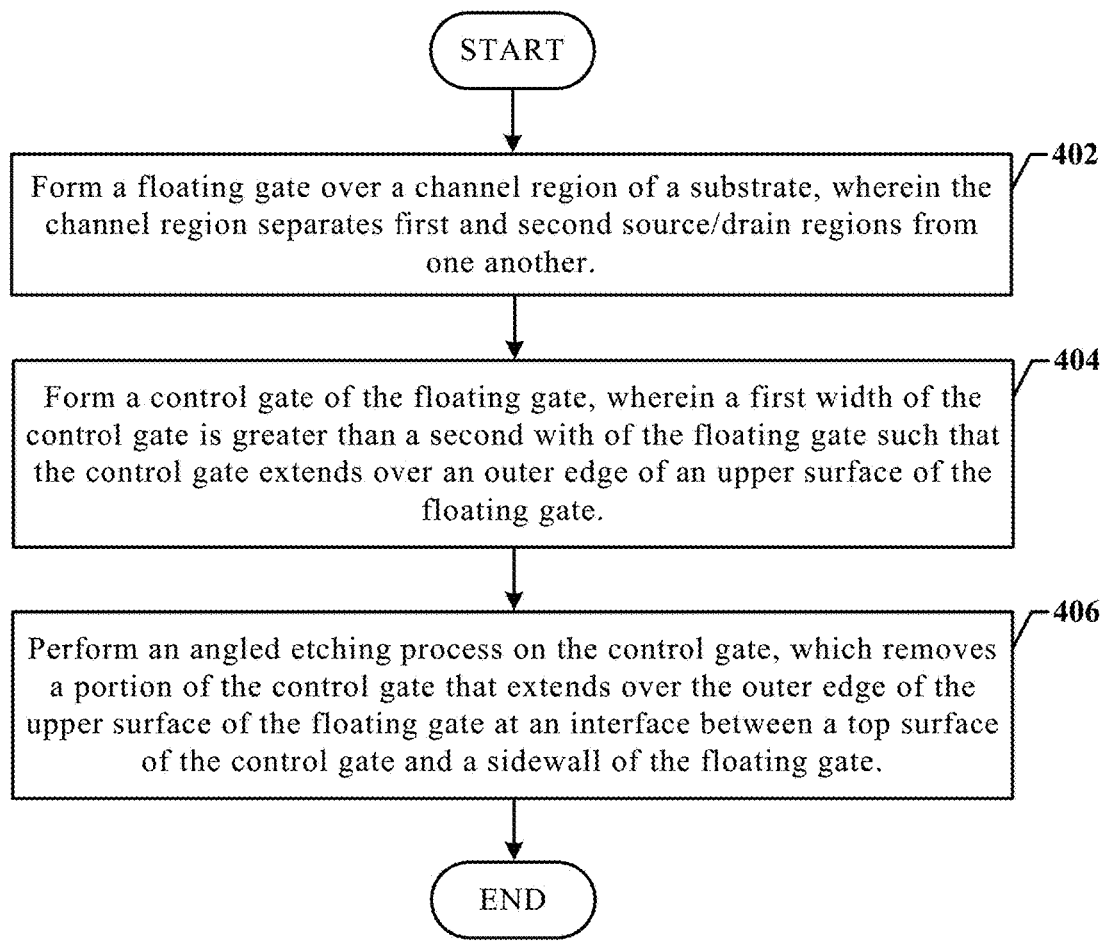
FIG. 4 illustrates some embodiments of a method to form a memory device.

FIG. 4 illustrates some embodiments of a method 400 to form a split gate memory device.

At 402, a floating gate is formed over a channel region of a substrate, wherein the channel region separates first and second source/drain regions from one another. The floating gate is separated from the substrate by a first dielectric (e.g., SiO₂).

At 404, a control gate is formed over the floating gate, wherein a first width of the control gate is greater than a second with of the floating gate, such that the control gate extends over an outer edge of an upper surface of the floating gate to form an overhang. The overhang in the erase path of electrons tunneling out of the floating gate in an erase mode of operation of the memory device.

At 406, an angled etching process is performed on the control gate and the floating gate, which removes the overhang. The etching process tapers a height of the control gate. The etching process and resulting memory device will be illustrated in greater detail in the embodiments of FIG. 5A-5D.

Figure 5A:
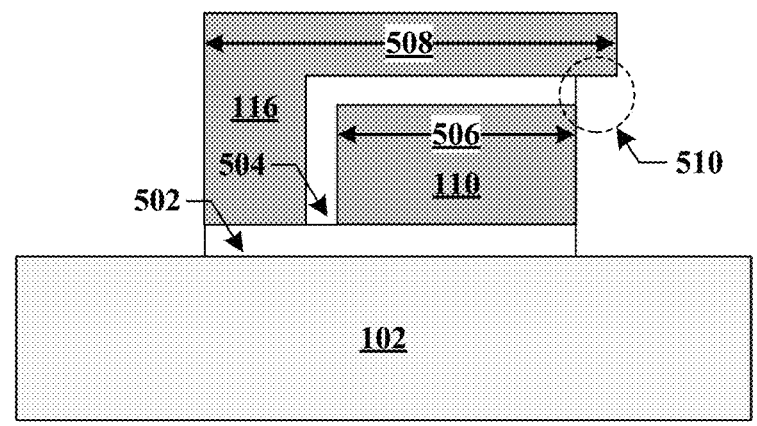
FIGS. 5A-5D illustrate a series of cross-sectional views that collectively depict formation of a memory device.

FIGS. 5A-5D illustrate a series of cross-sectional views that collectively depict formation of a memory device. In FIG. 5A, a memory device 500 is formed on a semiconductor substrate 102. The memory device comprises a floating gate 110 formed below a control gate 116. The floating gate 110 has an upper surface with a first width 506. The control gate 116 and has a lower surface with a second width 508 that is less than the first width 506. A first dielectric 502 separates the floating gate 110 from the semiconductor substrate 102, and a second dielectric 504 separates the control gate 116 from the floating gate 110. Due to this difference in width, the control gate 116 forms an overhang 510 past a sidewall of the floating gate 110.

Figure 5B:
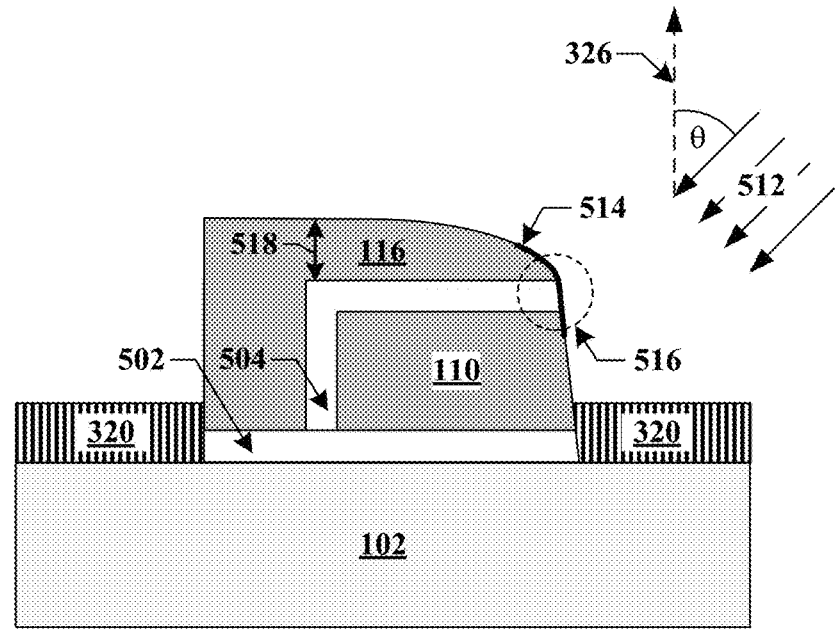

In FIG. 5B, an angled etching process 512 is performed on one side of the control and erase gates 116, 110, which removes the overhang 510, and also a portion of the sidewall of the floating gate 110 near its upper surface. In some embodiments the angled etching process 512 comprises an argon sputter or ion beam etch performed at an angle (θ) of between about 30° and 50° with a normal vector 326 to a surface of the substrate 102. As a result of the etching process 512, a height 518 of the control gate 116 relative to the upper surface of the control gate 116 tapers, such that a top surface of the control gate 116 diagonally-abuts the second dielectric 504 at an interface to a sidewall of the floating gate. Consequently, the top surface of the control gate 116, surface of the second dielectric 504, and the sidewall of the floating gate 110 form a smooth continuous surface 514 at an interface 516 between a top surface of the control gate 116 and a sidewall of the floating gate 110.

Figure 5C:
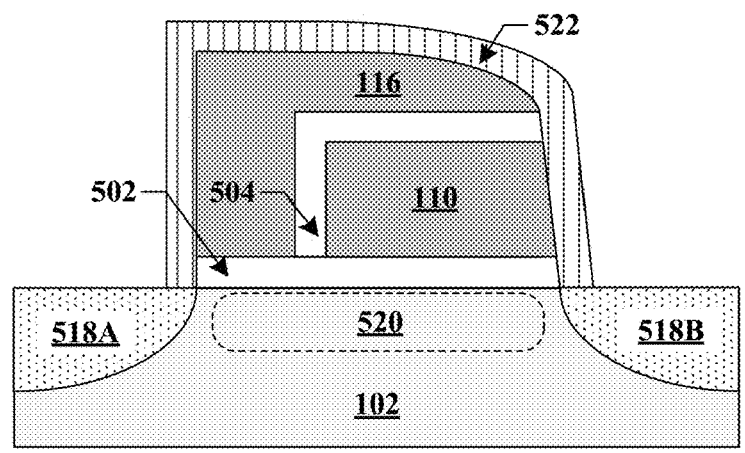

In FIG. 5C, first and second source/drain regions 518A, 518B are formed on either side of a channel region 520 formed below the control and floating gates 116, 110. An oxide-nitride-oxide (ONO) tri-layer 522 is the formed over the top surface and exposed sidewall of the control gate 116, as well as the exposed second dielectric and etched sidewall of the floating gate 110.

Figure 5D:
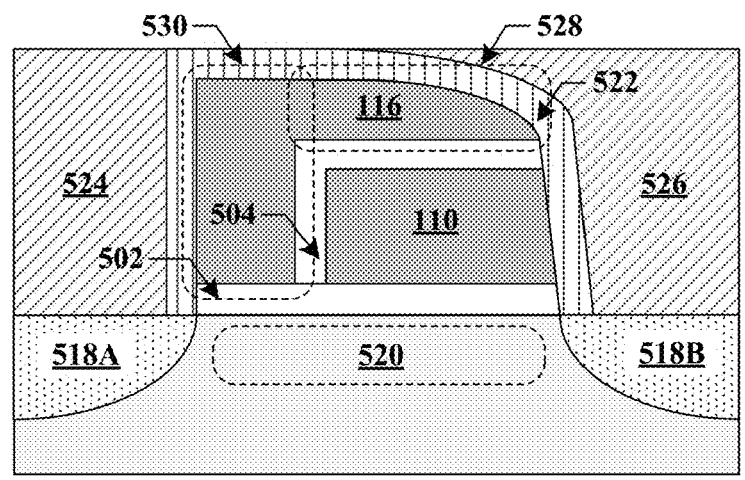

In FIG. 5D, a select gate 524 is formed over the first source/drain region 518A, which resides laterally adjacent the exposed sidewall of the control gate 116. Likewise, an erase gate 526 is formed laterally adjacent the exposed surface of the floating gate 110, opposite the select gate 524.

Figure 6:
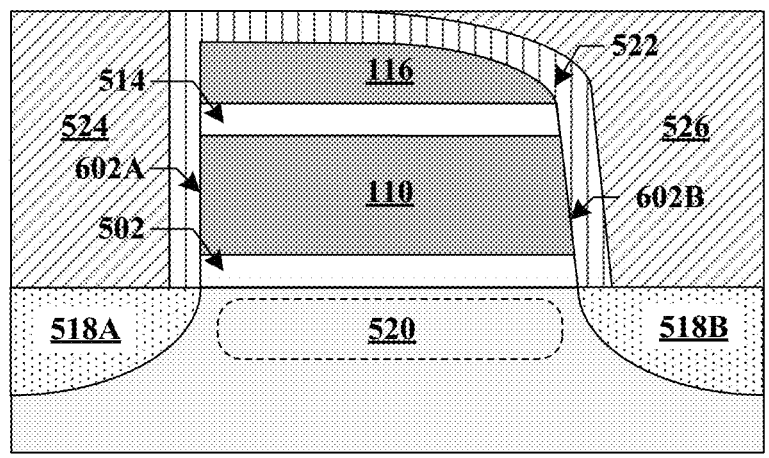
FIG. 6 illustrates some embodiments of a memory device.

For the embodiments of FIGS. 5A-5D, the control gate 116 comprises a horizontal portion 528 that extends over the top surface of the floating gate 110, and a vertical portion 530 that extends along a sidewall of the floating gate 110, in order to isolate the floating gate 110 from the select gate 524. In other embodiments, the control gate 116 comprises only a horizontal portion that extends over a top surface of the floating gate 110, and first and second sidewalls 602A, 602B of the floating gate are isolated from the select gate 524 and the erase gate 526, respectively, by an insulating layer (e.g., ONO), as illustrated in FIG. 6.

Therefore, some embodiments of the present disclosure relate to a memory device, comprising a semiconductor substrate comprising first and second source/drain regions, which are separated from one another by a channel region, and a floating gate arranged over the channel region, wherein a first dielectric separates the floating gate from the channel region. A control gate is arranged over the floating gate, and is separated from the control gate by a second dielectric. The floating gate has an upper surface with a first width, and the control gate has a lower surface with a second width that is less than the first width. First and second spacers are formed along sidewalls of the control gate, and arranged over outer edges of the floating gate upper surface. Lower sidewall regions of the first and second spacers taper down towards a neck region within the floating gate, wherein the neck region comprises a third width that is less than the second width of the upper surface.

Some embodiments relate to a method of forming a memory device. The method includes forming a floating gate over a first dielectric on a substrate, and forming a control gate over the floating gate. The method further includes forming first and second spacers along sidewalls of the control gate. The first and second spacers extend past outer edges of an upper surface of the floating gate. The method further includes performing an etching process on the first and second spacers to remove a portion of the first and second spacers that extends past the outer edges of the upper surface of the floating gate along an interface between the first and second spacers and the floating gate.

Other embodiments relate to a method of forming a memory device. The method includes forming a floating gate layer on a first dielectric layer over a substrate, forming a second dielectric layer over the floating gate layer, forming a control gate layer over the second dielectric layer, and forming a hard mask layer over the control gate layer. The method further includes performing a first etching process to pattern the second dielectric layer and the control gate layer according to the hard mask to form a second dielectric and a control gate. The method further includes forming spacers comprising one or more dielectric materials on the floating gate layer and along sidewalls of the second dielectric and the control gate. The method further includes performing a second etching process to pattern the floating gate layer and the first dielectric layer to form a floating gate and a first dielectric. The spacers straddle outer edges of an upper surface of the floating gate. The method further includes performing a third etching process to remove a portion of the spacers that extends over the outer edges of the upper surface of the floating gate at an interface between the spacers and the floating gate.

Still other embodiments relate to a method of forming a memory device. The method includes forming a floating gate over a substrate and forming a control gate over the floating gate. The control gate extends past an outer edge of an upper surface of the floating gate. The method further includes performing an angled etching process on the control gate to remove a portion of the control gate that extends past the outer edge of the upper surface of the floating gate. The angled etching process comprises a sputter etch or an ion beam etch performed at a non-zero angle relative to a normal vector to the upper surface of the floating gate.

While methods 200 and 400 have been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Further, spatially relative terms, such as "over," "on," "beneath," "below," "lower," "above," "upper" and the like, have been used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, comprising:
   forming a floating gate layer over a first dielectric on a substrate;
   forming a control gate over the floating gate layer;
   forming first and second spacers along sidewalls of the control gate;
   performing a patterning process on the floating gate layer according to the first and second spacers to define a floating gate, wherein the patterning process removes some of the floating gate layer from below the first and second spacers so as to cause bottom surfaces of the first and second spacers to extend from directly over the floating gate to past outer edges of an upper surface of the floating gate; and
   performing an etching process on the first and second spacers to remove a portion of the first and second spacers that extends past the outer edges of the upper surface of the floating gate.

2. The method of claim 1, further comprising:
   forming a source region and a drain region within the substrate on opposing sides of the floating gate.

3. The method of claim 1, further comprising:
   forming a tunneling dielectric layer along sidewalls of the floating gate and the first dielectric, wherein the tunneling dielectric layer has a smaller thickness than the first dielectric.

4. The method of claim 1, further comprising:
   forming a tunneling dielectric layer along sidewalls of the floating gate and along an upper surface and opposing sidewalls of the first dielectric.

5. The method of claim 1, wherein the etching process comprises an argon sputter etch or an argon ion beam etch.

6. The method of claim 1, wherein the etching process comprises a sputter etch or an ion beam etch performed at a non-zero angle relative to a normal vector to the upper surface of the floating gate.

7. The method of claim 1, wherein the etching process comprises a sputter etch or an ion beam etch performed at an angle of between about 30° and 50° relative to a normal vector to the upper surface of the floating gate.

8. The method of claim 1, wherein the floating gate has a curved sidewall prior to performing the etching process.

9. A method of forming a memory device, comprising:
   forming a floating gate layer on a first dielectric layer over a substrate;
   forming a second dielectric layer over the floating gate layer and a control gate layer over the second dielectric layer;
   forming a hard mask over the control gate layer;
   performing a first etching process to pattern the second dielectric layer and the control gate layer according to the hard mask to form a second dielectric and a control gate;
   forming spacers comprising one or more dielectric materials on the floating gate layer and along sidewalls of the second dielectric and the control gate;
   performing a second etching process to pattern the floating gate layer and the first dielectric layer and to form a floating gate and a first dielectric, wherein the spacers straddle outer edges of an upper surface of the floating gate; and
   performing a third etching process to remove a portion of the spacers that extend over the outer edges of the upper surface of the floating gate at an interface between the spacers and the floating gate, wherein a distance between outer sidewalls of the spacers facing away from the control gate along a line extending along a bottommost surface of the spacers is substantially equal to a width of a topmost surface of the floating gate after the third etching process is complete.

10. The method of claim 9, wherein the third etching process comprises a sputter etch or an ion beam etch performed at a non-zero angle relative to a normal vector to the upper surface of the floating gate.

11. The method of claim 9, wherein the second etching process and the third etching process are performed at different angles.

12. The method of claim 9, wherein a second distance between sidewalls of the spacers facing away from the control gate along the line extending along the bottommost surface of the spacers is greater than the width of the topmost surface of the floating gate prior to the third etching process.

13. The method of claim 9, further comprising:
   forming an anti-reflective layer over the substrate and along sidewalls of the first dielectric prior to performing the third etching process.

14. The method of claim 9, further comprising:
   forming a tunneling dielectric layer along sidewalls of the floating gate and the first dielectric, wherein the tunneling dielectric layer has a curved surface connected to a horizontal ledge vertically between the topmost surface and a bottommost surface of the floating gate.

15. The method of claim 9, wherein the distance between the outer sidewalls of the spacers facing away from the control gate along the line extending along the bottommost surface of the spacers is smaller than a width of a top surface of the first dielectric.

16. A method of forming a memory device, comprising:
    depositing a floating gate layer over a substrate;
    forming a control gate over the floating gate layer;
    forming spacers comprising one or more dielectric materials along sidewalls of the control gate and extending along an upper surface of the floating gate layer;
    performing a first etching process on the floating gate layer to form a floating gate, wherein outer sidewalls of the spacers overhang outermost edges of the floating gate; and
    performing a second etching process at a non-zero angle relative to a normal vector to an upper surface of the floating gate to achieve a smooth interface between a bottom region of the spacers and a top region of the floating gate.

17. The method of claim 16, wherein the second etching process comprises a sputter etch or an ion beam etch, wherein the non-zero angle is between about 30° and 50°.

18. The method of claim 16, further comprising:
    depositing a continuous tunnel dielectric layer along the spacers, along the smooth interface, and extending onto upper surfaces of the substrate.

19. The method of claim 16,
    wherein the floating gate is separated from the substrate by a first dielectric; and
    wherein the control gate is separated from the floating gate by a second dielectric.

20. The method of claim 1, wherein outer sidewalls of the first and second spacers are angled at one or more non-zero angles with respect to a line that is perpendicular to the upper surface of the floating gate.

* * * * *